United States Patent [19]

McPhee

[11] Patent Number: 4,467,320
[45] Date of Patent: Aug. 21, 1984

[54] MEASUREMENT OF A LINEAR VARIABLE DIFFERENTIAL TRANSFORMER SIGNAL BY PHASE CONVERSION

[75] Inventor: Walter J. McPhee, South Bend, Ind.

[73] Assignee: The Bendix Corporation, Southfield, Mich.

[21] Appl. No.: 375,516

[22] Filed: May 6, 1982

[51] Int. Cl.³ ............................................. H03K 13/00
[52] U.S. Cl. ............................. 340/347 SY; 318/661; 318/657; 304/431.02
[58] Field of Search ................. 340/347 AD, 347 SY, 340/347 CC; 318/656-661, 603; 364/817, 431.02

[56] References Cited

U.S. PATENT DOCUMENTS

| | | | |
|---|---|---|---|
| 2,894,256 | 7/1959 | Kronacher | 340/347 SY |
| 3,353,175 | 11/1967 | Brook | 340/347 SY |
| 3,357,012 | 12/1967 | Brook | 340/347 SY |
| 4,355,305 | 10/1982 | Cording | 340/347 SY |

FOREIGN PATENT DOCUMENTS

2806655  8/1978  Fed. Rep. of Germany ...... 340/347 SY

Primary Examiner—C. D. Miller
Attorney, Agent, or Firm—Ken C. Decker

[57] ABSTRACT

A measurement system for converting the outputs of dissimilar transducers into digital numbers by means of a phase conversion technique. The outputs of a plurality of dissimilar transducers are generated as pairs of amplitude modulated sinusoidal signals. All AM signal pairs are converted into phase modulated signal pairs by a plurality of identical conversion circuits where the phase difference between at least one PM signal pair is linearly related to the measured parameter of the transducer associated therewith. The phase differences for each transducer is converted into a digital number by counting increments of time between the zero crossings of each pair of phase modulated signals and outputting the resulting count to a data buss of a control processor. Transducer parameters which are nonlinearly related to their phase differences are compensated by a correction factor which is calculated by knowing the error between any particular measured input and the linear input.

7 Claims, 11 Drawing Figures

MEASUREMENT OF A LINEAR VARIABLE DIFFERENTIAL TRANSFORMER SIGNAL BY PHASE CONVERSION

The invention pertains generally to the demodulation of signals from dissimilar transducers into a digital form representative of an element position and is more particularly directed to such demodulation by a phase conversion technique.

The linear variable differential transformer (LVDT) is a well-known transducer in systems for the control of gas turbine engines and is used extensively in such control systems as a feedback element. The LVDT provides a measurement of the actual linear position of a controlled element such as a fuel valve, compressor vane, exhaust nozzle, or the like. The control system may then regulate the position of the controlled element from an error signal based upon the difference between the actual position and a desired position scheduled from any of the engine operating parameters.

Prior to the present invention, the most common demodulation technique for an LVDT was to amplitude demodulate the combined sinusoidal output from the dual sensing windings. The amplitude detected in this manner was proportional to the difference between the amplitudes output from each winding. The differencing technique provides a nullpoint and compensates this point for frequency drift of the carrier signal due to changing component values with age, temperature, or other environmental factors. This technique of demodulation with error compensation is commendable but produces an analog output which is not facilely used by modern engine control systems which are microprocessor based. Another conversion of the analog signal into a digital signal must be performed before the engine control can advantageously use the signal.

There are however, other measurement systems that do advantageously interface with microprocessor-based controls because of their digital output. One such measurement system contemplates the phase conversion of a pair of sinusoidal signals from a resolver (rotary position transducer) into a digital number. Initially, the resolver generates two amplitude modulated (AM) signal $\cos \theta \sin(wt)$ and $\sin \theta \sin(wt)$ where the arguments $\theta$ w are the angle to be measured and the radial frequency of a carrier, respectively. The pair of AM signals are converted by a lead-lag phase network to a pair of phase modulated signals $\sin(wt-\theta+45°)$, $\sin wt+\theta-45°$ where the phase difference between the generated signals $(2\theta-90°)$ is proportional to the amplitude of the incoming signals. In this system a zero crossing of the leading phase modulated signal is used to initiate counting high speed clock pulses in a counter. The counter is enabled until a zero crossing of the lagging phase modulated signal occurs. The counter at that time contains a digital number representative of the time difference and hence phase difference between the two phase modulated signals. Since the phase difference is proportional to the rotary position of the resolver, the digital number is a representation of this position.

A resolver system of the type described is more fully disclosed in a U.S. patent application Ser. No. 143,218, filed in the names of Morton et al. on Apr. 24, 1980, now U.S. Pat. No. 4,355,305 and which is commonly assigned with the present application. The disclosure of Morton et al. is hereby expressly incorporated by reference herein.

Another Resolver to Digital Angle Converter of this type is further illustrated at pages 434-437 of "Electronic Analog/Digital Coversions" by Hermann Schmid and published by Van Nostrand Reinhold Company. The disclosure of Schmid is hereby expressly incorporated herein by reference.

Often a plurality of rotary position tranducers and linear position transducers of the types described above are necessitated in the same control system. Just as often, other types of position or engine parameter transducers are used in combination with one or both types of these tranducers in the same control system. Heretofore, it was conventional to use a different demodulation technique which was unique to each type of transducer such as those dissimilar techniques described for the rotary and linear position transducers. This was thought to be required because of the dissimilarity in the transducer output signals due to the physical configuration of each transducer.

Only after demodulation to either an analog or digital signal of a similar type could the signals from dissimilar transducers time share common circuitry. This creates a substantial amount of unnecessary circuitry and increases the cost of the overall control. Therefore, it would be highly desirable to be able to demodulate many different types of transducer signals by a common technique. Moverover, common demodulation would permit the use of multiplexed digitizing circuitry to convert the signals into a digital form easily acceptable to a microprocessor.

SUMMARY OF THE INVENTION

Accordingly, it is the object of the invention to provide a phase conversion technique that can be used to convert the output of dissimilar transducers into digital numbers. Particularly, the invention will be described in the context of a system for dissimilar resolvers of linear positions and of rotary positions which converts the positions into digital numbers.

The invention contemplates using the physical positionings of the dissimilar transducers to amplitude modulated a pair of sinusoidal signals. The invention provides a phase conversion circuit that converts the pair of amplutude modulated (AM) sinusoidal signals into a pair of phase modulated (PM) sinusoidal signals where the phase shift between the two PM signals is a function of the position or parameter that is desired to be measured. The zero crossings of the PM signals are detected to initiate and terminate the incrementation of a counter which then contains a count proportional to the time delay between the zero crossings. This provides a digital representation of the phase delay and thus a number proportional to parameter to be measured.

A common type of phase conversion circuit is adapted to perform an amplitude to phase conversion for all signals such that the resulting phase difference between at least two of the PM signals is a linear function of the position or parameter to be measured. Any of the other pairs of PM signals for the remaining transducers can then be nonlinear functions of the positions or parameters to be measured. After the digital conversion of all pairs of PM signals, the nonlinear functions are linearized by taking the difference between a known function relating the measured parameter in terms of the linear parameter and the linearized version of that function.

In the preferred embodiment, the outputs of a plurality of angular resolver transducers and a plurality of linear variable differential transformers are converted into digital numbers. The output from each resolver is a pair of amplitude modulated sinusoidal signals $\sin\theta \sin(wt)$, and $\cos\theta \sin(wt)$ where w is the carrier frequency of the excitation signal and $\theta$ is the angular position to be measured. These AM signals are converted by the phase conversion circuit into phase modulated signals of the form $\sin(wt+\theta-45°)$, $\sin(wt-\theta+45°)$ which have a phase difference of $(2\theta-90°)$. The phase difference for the PM signals of the resolver transducer is then a linear function of the position $\theta$ that is to be measured. The digital representation for $\theta$ is subsequently generated by the zero crossing technique described.

The output from each LVDT transducer is additionally generated as a pair of amplitude modulated sinusoidal signals of the form $K \sin(Wt)$, $(1-K)\sin(wt)$ where w is the radial frequency of the carrier and K is the linear position of the transformer armature as measured from a reference The same type of phase conversion circuit is utilized to convert these signals into the phase modulated form $\sin(wt+\theta-45°)$, $\sin(wt-\theta+45°)$ where the same phase difference $(2\theta-90°)$ is resolved. The digital representation of the phase difference is then generated by the zero crossing technique. This method would calculate an exact answer for the position K if K were linear (one-to-one correspondence) with $\cos\theta$ and the quantity $1-K$ were linear with $\sin\theta$.

However, the variables k, $1-K$ are nonlinear with respect to $\theta$ and only approximate the values $\cos\theta$, $\sin\theta$ over the range of 0°-90° as K varies from 0-1. The invention therefore, provides a linearization of the digital output from the known error of these approximations. The digital output is nonlinear in terms of $\theta$ by the same degree that $\sin\theta$ and $\cos\theta$ are different from K, $1-K$ over the range 0°-90° as K varies from 0-1. However, the variable $\theta$ may be expressed in terms of K. The nonlinear $\theta$ in terms of K can be expressed as the arctangent of the ratio of $1-K/K$. This ratio expresses the function $\tan\theta$ in terms of K or $\sin\theta/\cos\theta$. By differencing this value with a linear value of $\theta$ as a function of $K\times(90°)$ the known error of the approximation can be compensated.

It is evident that other other transducers of many different types can have their outputs converted into digital numbers by this technique. The method will work for any transducer having a pair of AM sinusoidal outputs having a measured parameter which can be related to the linear phase variable $\theta$. Further, it is well within the scope of the invention to chose another phase variable and linearize it by a different phase conversion circuit and then relate the other transducer variables to it.

One advantage of the invention is illustrated in the preferred implementation where the output of a plurality of dissimilar transducers are multiplexed by a single set of counting circuitry for conversion of the digital numbers. Because the same conversion technique is utilized for both the linear and angular positions, no individualized conversion or cicuitry for each type of transducer is necessary.

Additionally, the preferred implementation illustrates a microprocessor-controlled operation of the conversion which is capable of receiving digital data from the different types of transducers in approximately the same time. This produces a system which is transparent to the type of transducer used and the position of their connection at any port of the multiplexer which greatly aids design flexibility for system usage.

These and other objects, features, aspects and advantages of the invention will be more fully described and better understood if a reading of the following detailed description is undertaken in conjunction with the attached drawings, wherein:

DETAILED DESCRIPTION

Figure 1:
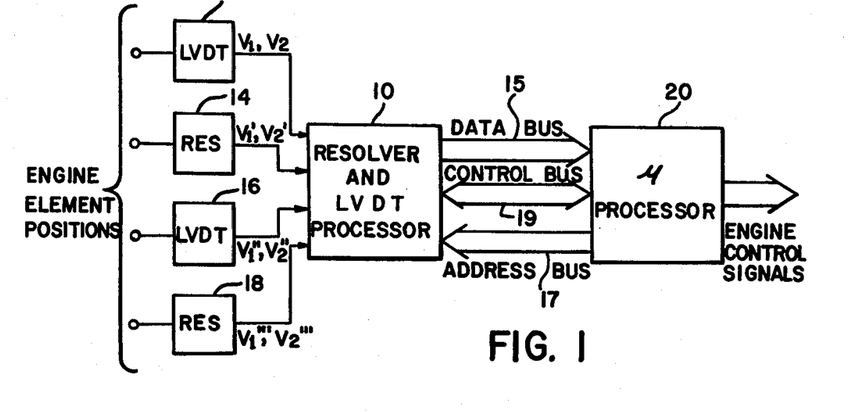
FIG. 1 is a system block diagram of a measurement system for converting dissimilar transducer signals into digital numbers which is constructed in accordance with the invention.

With reference now to FIG. 1 there is shown a measurement system that receives certain engine element positions or parameters and processes them into digital data by a phase conversion technique so that a microprocessor 20 may read the data directly. The microprocessor 20 generates engine control signals from this data and other variables to regulate a gas turbine engine (not shown). The engine element positions may be for example stator vane angles, fuel valve position, augmentor nozzle position, compressor bleed opening, etc., The measurement system comprises a resolver and LVDT processor 10 which receives the engine element positions from a plurality of transducers including linear variable differential transformer (LVDT) 12, resolver 14, LVDT 16, and resolver 18. Linear positions are transduced by the LVDT 12, and LVDT 16 while rotary or angular positions are transduced by the resolvers 14 and 18. The resolver and LVDT processor 10 communicates with the microprocessor 20 via a data buss 15, an address buss 17, and a control buss 19. The microprocessor 20 via the control buss 19 requests the processor 10 to convert one of the engine element positions into digital data which can be transferred to the processor 20 by the data buss 15. The particular device that is requested can be chosen by providing a digital number assigned to that particular transducer to the processor 10 via address buss 17.

The processor 10 utilizes the same phase conversion technique for all the transducers 12, 14, 16, and 18, notwithstanding the dissimilar output signals developed by the transducers. The output signals of an individual transducer, for example V1, V2, of LVDT 12 are specially generated as a pair of amplitude modulated sinusoidal signals that are converted into phase modulated signals. Output signals V1', V2', V1'', V2'', V1''', V2''' of transducers 14, 16, 18, respectively, are pairs of AM sinusoidal signals which are converted to corresponding pairs of phase modulated signals. Each type of transducer, because of its unique physical confuiguration, produces a dissimilar amplitude modulation on the pair of input signals.

As will be more fully apparent hereinafter, all pairs of the phase modulated signals are multiplexed to common conversion circuitry by the processor 10. The common conversion circuitry comprises a digital counting technique common to all the pairs of phase modulated signals. The digital counting technique is then provided to produce a digital number indicative of a particular phase shift related to the engine element position which can be placed on data buss 15 for the microprocessor 20. The configuration implemented provides a system which is transparent to the positioning of the different types of transducers and uses common circuitry to advantage.

Figures 2, 3, 4:
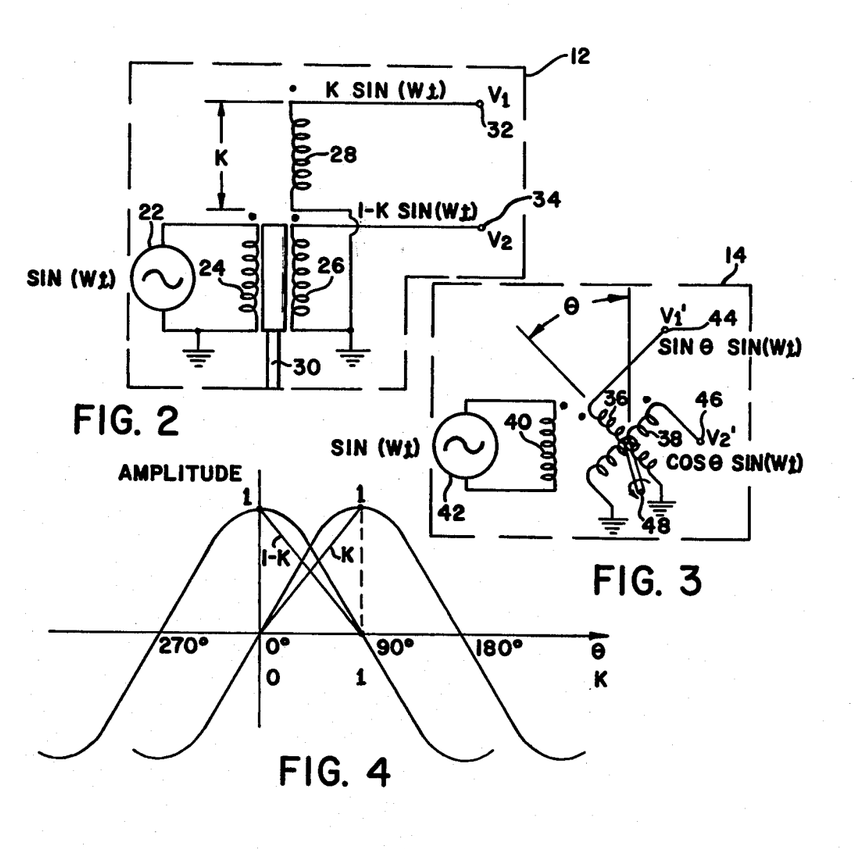
FIG. 2 is an electrical schematic view of one of the linear variable differential transformers illustrated in FIG. 1.
FIG. 3 is an electrical schematic view of one of the angular resolvers illustrated in FIG. 1.
FIG. 4 is a waveform comparison view of the amplitude modulations of the carrier frequency for the LVDT and angular resolver illustrated in FIGS. 2 & 3.

With respect now to FIG. 2, there is shown an electrical schematic of the LVDT 12. It is understood that the LVDT 16 or other of this type are identical to the LVDT 12 and operate in a similar manner which will now be described. The LVDT 12 comprises a primary winding 24 which is excited by a sinusoidal carrier signal, sin (wt), from a generator 22. The LVDT further has secondary windings 26 and 28 which are wound such that they are magnetically coupled in the phase shown by the respective coupling dots to the primary winding 24. Each secondary winding 26, 28 has one of its terminals connected commonly to ground while the other terminal 32, 34, respectively, provides an output signal for the transducer. A movable armature 30 of a magnetically permeable material couples the primary winding to the secondary winding by it position. The armature 30 may be connected by mechanical means to any element of an engine whose linear position it is desired to be measured. The initial or reference position of the armature 30 is shown whereby there is a one-to-one coupling between the primary 24 and the secondary 26. The armature 30 is movable from this initial position to a position K where the primary winding 24 is fully coupled to the other secondary winding 28.

Thus, as the armature 30 moves between its initial position and its maximum position, the output of the secondary winding 26 at terminal 34 will be a sinusoidal signal, sin (wt), which is amplitude modulated by the position $(1-K)$. Similarly, the other secondary winding 28 will produce an output at terminal 32 which is a sinusoidal signal sin (wt) which is amplitude modulated by the position of the armature as a function of K. This provides an output signal V1 which is equivalent to K sin (wt) and an output signal V2 which is equal to $(1-K)$ sin (wt). If the outputs are unitized (max $K=1$), then the output V2 varies from an amplitude of one to zero as the armature moves from a zero position to K while the amplitude of the signal V1 varies from zero to one for the same movement.

The resolver 14 will now be more fully described with respect to the electrical schematic illustrated in FIG. 3. It is understood that the resolver 18 or others of this type are identical in construction and operation with the following description. The resolver 14 comprises a primary winding 40 and two orthogonal secondary windings 38 and 36. The primary winding is excited by a sinusoidal signal sin (wt) from a generator 42. The two secondary coils are mounted at a 90° angle to each other and cross at an axis revolving about resolver shaft 48. The resolver shaft 48 may be attached to any engine element whose rotary position it is desired to be measured. Rotation of the resolver shaft 48 from a reference position causes an amplitude modulation to occur on the sinusoidal excitation from the primary such that it is proportional to the angle $\theta$ as measured from the reference position.

Since the secondary winding 36 is fully coupled to the primary winding 40 when the reference angle $\theta$ is zero and uncoupled when $\theta$ equals 90°, the amplitude modulation produced on the output signal of the winding 36 is sin $\theta$. Thus, the output signal V1' output from the secondary winding 36 via terminal 44 is sin $\theta$ sin (wt). Similarly, since the secondary winding 38 is 90° out of phase with the secondary winding 36, its rotation will provide an amplitude modulation which is zero when $\theta=0°$ and one when it is fully coupled at $\theta=90°$. Therefore, the output signal V2' from the terminal 46 will be cos $\theta$ sin (wt).

A comparison between the two dissimilar amplitude modulations for the different transducers will now be discussed with reference to FIG. 4. In the Figure unitized versions of the amplitudes for the outputs of transducers 12, 14, have been graphed as a function of the variables $\theta$ and K. It is seen that the cos $\theta$ amplitude signal is similar to or approximates the $1-K$ signal in that they both initiate at one for $\theta=0$, $K=0$ and decrease to zero at $\theta=90°$ $K=1$. The companion signals for these two amplitude modulations sin $\theta$, K are additionally similar or approximate each other in that they initiate at zero for $\theta=0$, $K=0$, and increase to one at $\theta=90°$, $K=1$. Since the amplitude of each signal V1, V2 approximates the amplitude of the signals V1' and V2' over the range $\theta=0°$ to 90°, $K=0$ to 1, this suggests that the same conversion technique can be used to transform the signals into digital numbers. Moreover, if one of the pairs, particularly V1' V2', can be converted relatively accurately into a linear function, the other pair V1, V2, which is approximation of those signals over a particular interval, can be found by knowing the error between the approximations.

Therefore, the invention provides a method for transforming the signals V1' V2' from resolver 14 or identical signals V1''' or V2''' from resolver 18 by a phase conversion technique into a digital number which is representative of a linear function of the angle $\theta$. The same conversion technique is subsequently used to convert the signals V1, V2, from LVDT 12 or V1'', V2'' from LVDT 16 into a digital number representative of a nonlinear function of the angle $\theta$. This nonlinear measurement $\theta$ can be corrected by knowing the error introduced in the measurement by the approximation $(1-K)$ equals sin $\theta$ and between the approximation K equals cos $\theta$.

Figure 5:
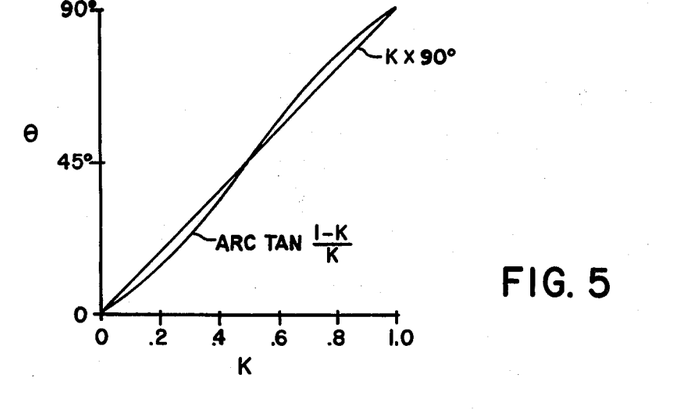
FIG. 5 is a pictorial representation of the error difference between the linear and nonlinear forms of the argument $\theta$ as a function of the position K for a linear variable differential transformer.

The correction method that is advantageously used will now be more fully disclosed with reference to FIG. 5 where the two functions of $\theta$ (the linear, and nonlinear) have been graphically set forth. It is evident that if K were linear with cos $\theta$, then the graph of the function $K \times 90° = \theta$ would give the accurate result to finding K after a θ had been developed by the digital conversion. However, this is not the case because K only approximates cos θ but the error difference is a known function. That function is the arc tangent function of 1−K/K in which the nonlinear θ can be expressed in terms of K. The error function is then the difference (vertical distance) between these two functions, θ=K×90° and θ=arc tan (1−K)/(K). It can be seen that the error difference is zero at θ=0°, 45°, and 90°. While the error is largest at θ=22.5, and 67.5°. Further, it is negative for angles between 0° and 45° and positive for angles between 45° and 90°. The correction is accomplished by obtaining a value for θ, for example 30°, from the digital number and then subtracting the number of error correction degrees found from the graphs of FIG. 5. This will provide a corrected measurement for the angle θ from which the value of K may be extracted by the formula K=cos θ.

Figure 6:
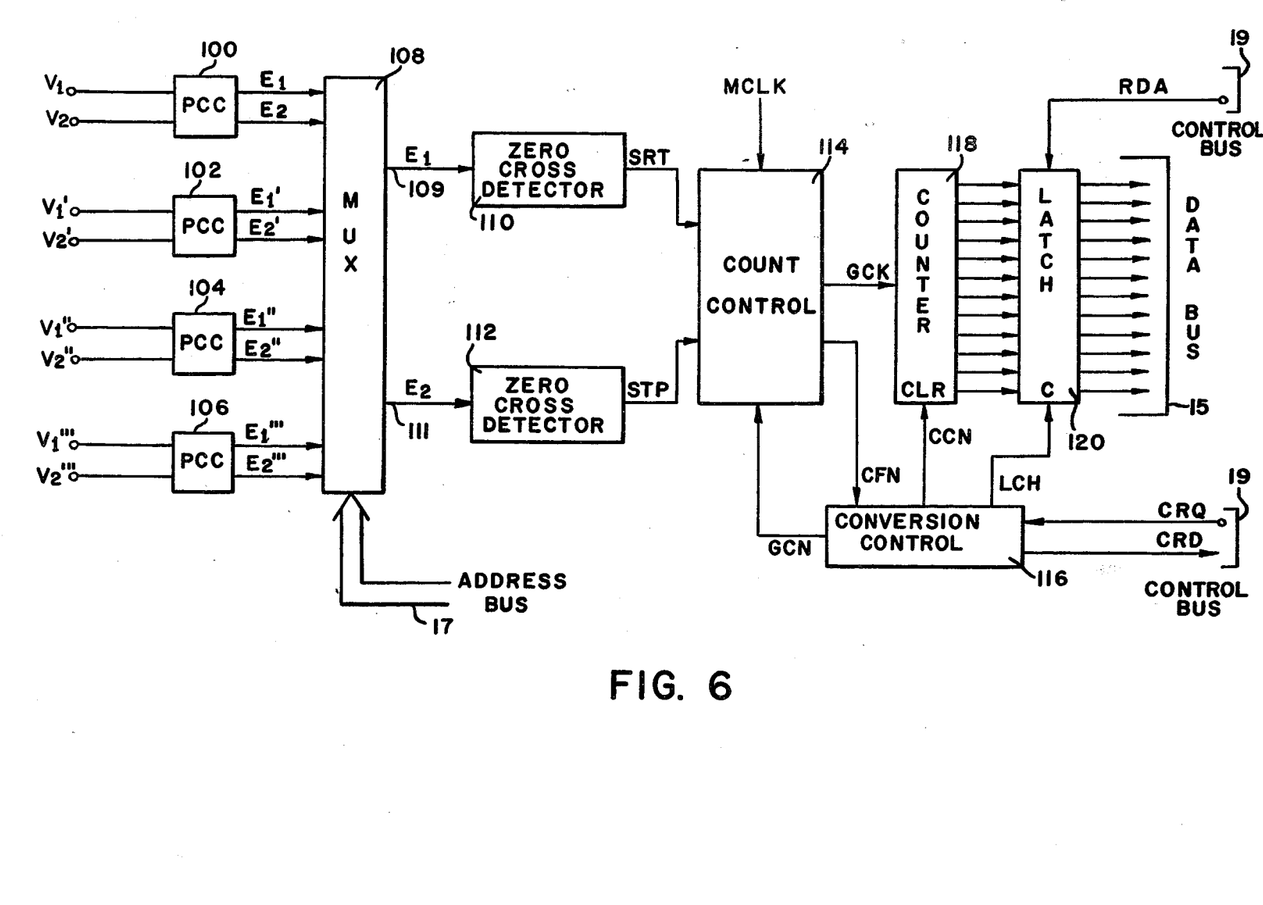
FIG. 6 is a detailed block diagram of the Resolver and LVDT processor illustrated in FIG. 1.

FIG. 6 will now be more fully described to disclose the imnplementation of the preferred form of the resolver and LVDT processor 10 which converts the amplitude modulated sinusoidal signals from the transducers 12, 14, 16, and 18, into digital data. Each pair of sinusoidal signals, for example, V1, V2 is input to a separate phase conversion circuit 100 to provide a pair of phase modulated signals E1, E2, therefrom. Likewise, signals V1', V2' are converted in phase conversion circuit 102 to produce a similar pair of phase modulated signals E1', E2' and so on, for phase conversion circuits 104 and 106. The pairs of phase modulated signals E1, E2, ... E1''', E2''' are input to separate ports of a multiplexer 108. The address buss 17 from the microprocessor 20 is connected to the multiplexer port selection circuitry such that an address selection will produce one of the pairs of signals as outputs 109, 111 from the multiplexer 108.

The outputs of the multiplexer 109, 111 are received by zero cross detector 110, 112, respectively. The zero cross detector 110 provides a start signal SRT at its output upon determining the phase modulated signal E1 has made a transition from one polarity to the other across a reference voltage. The zero cross detector 112 similarly detects when the phase modulated signal E2 crosses the reference voltage and generates a stop signal STP as an indication thereof. The signals SRT and STP are input to a count control circuit 114 which gates a gated clock signal GCK to the clock input C of a counter 118. The gated clock signal GCK is derived from a high speed master clock signal MCLK additionally input to the count control 114. The counter 118 has a digital output connected to the inputs of a latch 120 for providing data buss 15 with a digital number representative of the phase difference beween the chosen pair of signals E1, E2.

The count control 114, counter 118, and latch 120, are under control of the microprocessor 20 which by means of a conversion control circuit 116 and signals on the control buss 19 sequences the conversion operation. The conversion control 116 applies a gate control signal GCN to the count control circuit 114 enabling the counter 118 to count with the gated clock signal GCK and latches the data from the counter into the latch 120 by means of a latch signal LCH applied to the clock input C of the device when the conversion is finished. Further, the conversion control circuit 116 signal receives from the count control circuit 114 a conversion finish signal CON FIN which indicates that the conversion has been accomplished and applkies to the clear input CLR of counter 118 a clear signal CCN to reset the counter.

Basic operation of the circuit is under control of the microprocessor 20 which addresses the particular transducer which it desires to perform a conversion on by applying a digital number on address buss 16. That number which is assigned to a particular transducer causes the multiplexer selection circuitry to gate the chosen pair of signals E1, E2 to the zero cross detectors. The microprocessor 20 simultaneously provides a conversion request signal CRQ to conversion control circuit 116. The conversion control circuit 116 by means of the gate control signal GCN then allows a start signal SRT from the zero cross detector 110 to begin the counter on the next zero crossing of the phase modulated signal E1. The counter 118 is allowed to count the gated clock signal GCK until a stop signal STP is applied from zero cross detector 112. This indicates the phase modulated signal E2 has made a zero crossing at that time and the phase difference between the signals E1, E2 has been registered in the counter.

The gated clock GCK is terminated at this time and the conversion finish signal CFN transmitted to the conversion control circuit 116. The contents of the counter 118 are then latched into the latch 120 by the latch signal LCH and a conversion ready signal CRD transmitted to the microprocessor. The data may be read by the microprocessor 20 by applying a read data signal RDA to the latch 120 which then transmits the data via buss 15.

Figure 7:
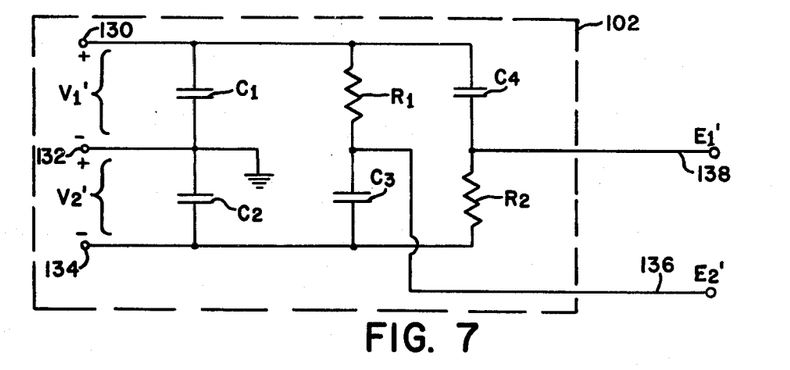
FIG. 7 is a detailed electrical schematic view of one of the phase conversion circuits illustrated in FIG. 6.

The preferred implementation for each of the phase conversion circuits 100, 102, 104, and 106 will now be more fully disclosed with respect to FIG. 7. The phase conversion circuits, for example phase conversion circuit 102 for resolver 14, comprise a resistive-capacitive phase shift network with input terminals 130, 134, connected to the output terminals of the respective transducer. Terminal 132 is connected as a common ground to the transducer. The phase conversion circuit 102 includes a pair of filter capacitors C1 and C2 connected between the grounded terminal 132 and each of the signal terminals 130 and 134. The purpose of the filter capacitors is to shunt any high frequency noise on the signals V1' and V2' to ground.

A resistor R1 is connected between terminal 130 and an output terminal 136 while a capacitor C3 is connected between input terminal 134 and output terminal 136. In a similar configuration a resistor R2 is connected between input terminal 134 and the output terminal 138 while a capacitor C4 is connected between input terminal 130 and the output terminal 138. Input signals V1 and V2 combine via the resistor R1, R2 and capacitor C3, C4 combinations to become the output signals E2' at terminal 136 and output signal E1' at terminal 138.

The signal E1' is generated as a leading (in the phase domain sinusoidal signal which is proportional to sin (wt+θ−45°) at terminal 138 and a lagging (in the phase domain) sinusoidal signal E2' proportional to sin (wt−θ+45°) at terminal 136. These particular forms of the equations are the result of the pairs R1, C3, and R2, C4 having time constants which are equivalent and of the form: WRC=1. From these equations it is evident that the amount of relative phase shift or time delay between the leading and lagging signals E1' and E2' is proportional to the angle θ. The actual phase shift is the difference between the two phase angles which modulate the carrier frequency or 2θ−90°.

It therefore follows that the time delay between the zero crossings of the phase shifted signals E1 and E2 is equivalent to the phase difference 2θ−90° which is a linear function of the position θ to be measured for the resolver 14. Any of the other transducer signals, for example V1, V2, or V1″, V2″ from the LVDTs will be converted into phase shifted signals E1, E2, E1″, E2″ having a phase delay equivalent to 2θ−90° where θ is nonlinear with respect to the amplitude modulation (K) on the input signals V1, V2.

The phase conversion circuit just described is disclosed as an advantageous implementation but should not be used to limit the invention. A number of other phase conversion circuits and techniques can be used to convert the pairs of AM signals to pairs of PM signals where the phase difference is related to the parameter measured. The requirements for the phase conversion is that the phase shift for each circuit be a function of the parameter measured and wherein at least one function is a linear function of a measured parameter.

Figure 8:
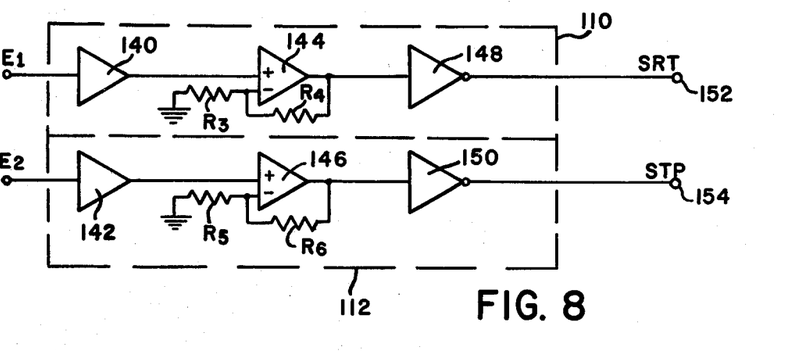
FIG. 8 is a detailed electrical schematic view of the zero cross detectors illustrated in FIG. 6.

The phase shifted sinusoidal signals E1 and E2 are received by the zero cross detectors 110 and 112, respectively, after being multiplexed by the multiplexer 108. Detailed schematic circuits of the preferred implementation of the zero cross detectors are shown in FIG. 8. Each identical circuit 110, 112 includes unity amplifiers or buffers 140 and 142 which prevent loading the phase conversion circuits. The outputs of the buffers 140, 142 are connected to the respective noninverting inputs of comparators 144, 146. Each of the comparators 144, 146 has a relative high impedance resistor, resistor R4 for comparator 144 and resistor R6 for comparator 146, connected between its output and its inverting input. Further, a relatively low impedance resistor, resistor R3 and resistor R5, respectively, is connected between ground and the noninverting input of the comparators 144 and 146. This configuration provides the comparators 144, 146 with a small positive hysteresis to reduce the possibility of the comparators being triggered by low level noise during the negative-to-positive transitions of the leading and lagging signals E1 and E2.

Figure 11:
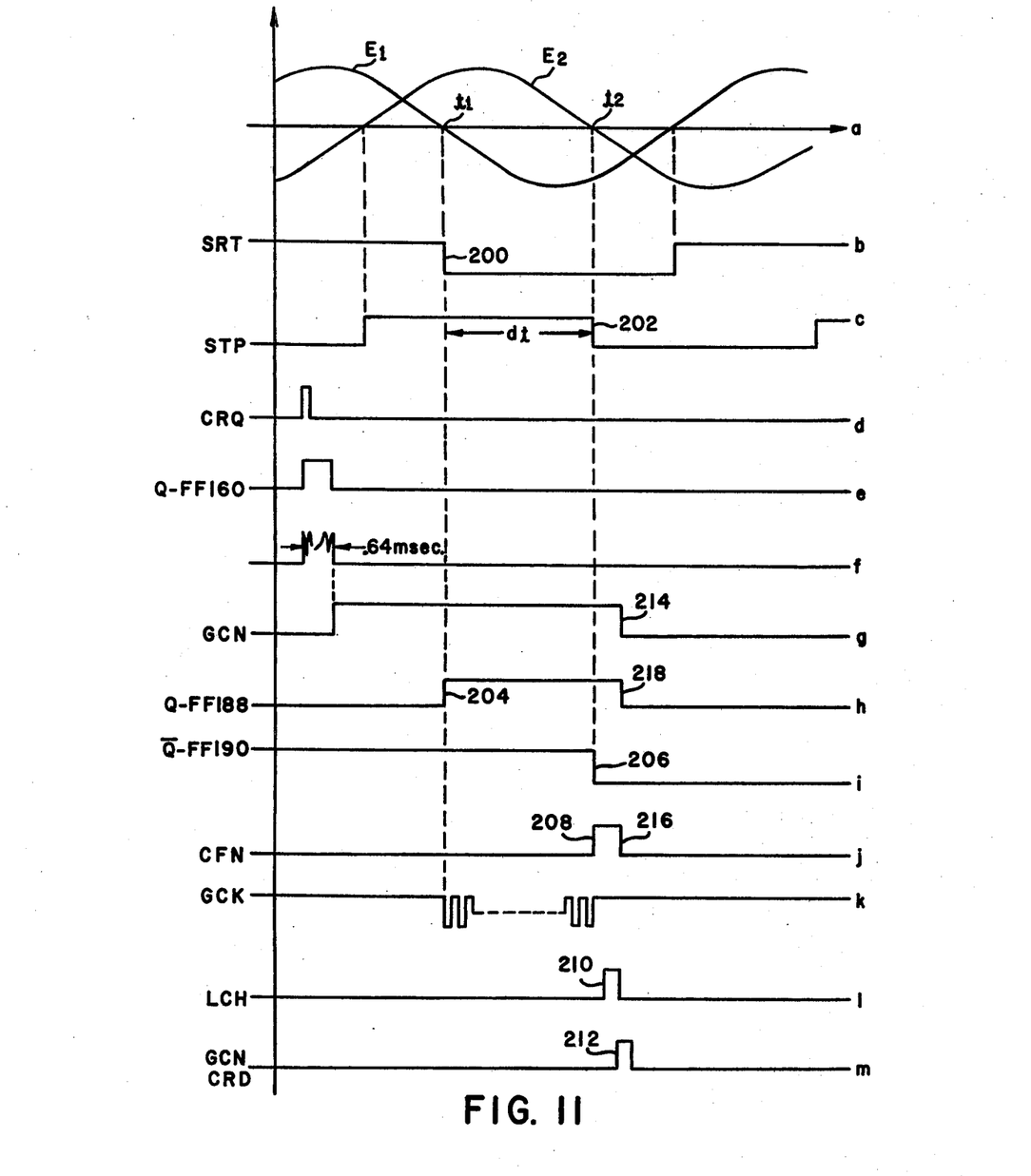
FIG. 11 is a pictorial representation of a series of waveform diagrams illustrating various signals in the circuits illustrated in FIGS. 6 through 10.

The outputs of the comparators 144, 146 change state from a logic one to a logic zero when their input voltages make a positive-to-negative transition through zero volts. The outputs of the comparators 144, 146 are connected to the inputs of inverting Schmitt triggers 148 and 150 which, without multiple triggering, produce the start signal SRT and the stop signal STP which are compatible with other TTL logic. Thus, the negative going edges of the SRT and STP signals are produced at the positive-to-negative zero crossings of the phase modulated signals E1 and E2 as illustrated in FIG. 11. Since the phase delay t1-t2 between the zero crossings of the phase modulated signals is proportional to the angle θ, it follows that the time delay dt between the negative transitions of the SRT and STP signals is also proportional to the angle θ.

Figure 9:
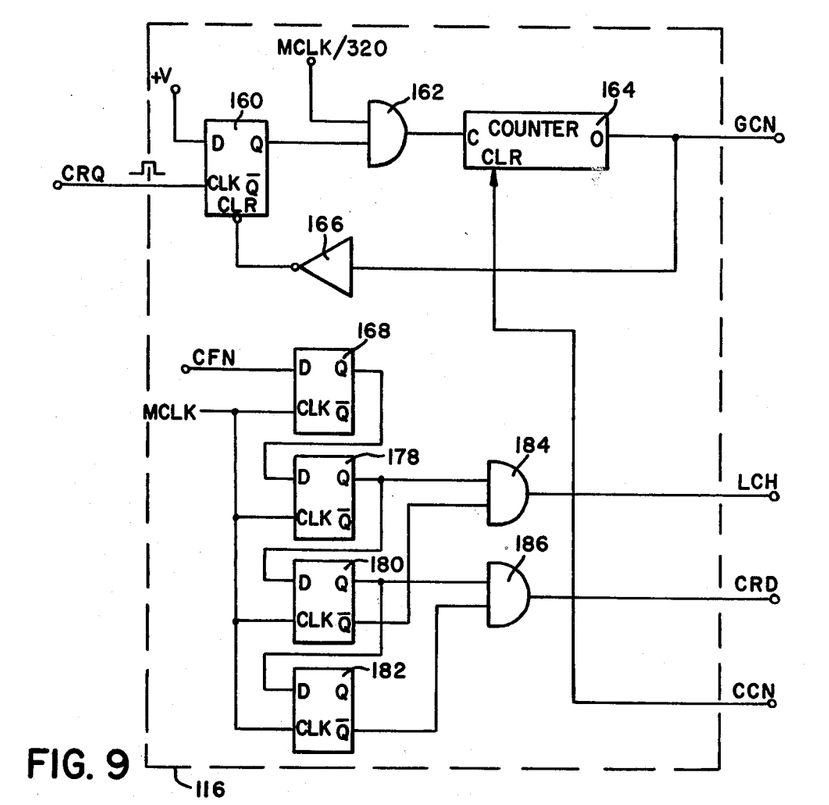
FIG. 9 is a detail electrical schematic view of the conversion control illustrated in FIG. 6.

The conversion control circuit 116 is shown in more detail in FIG. 9. The conversion control 116 includes a D flip flop 160 which has its D output tied to a positive voltage source plus V. Its clock input CLK is connected to the control buss 19 of the microprocessor to receive the conversion request signal CRQ. The Q output of the device is connected to the input of an AND gate 162 whose output clocks the count input C of a counter 164. The other input of the AND gate 162 receives a clock signal which is the master clock signal MCLK divided by a predetermined constant, in this case 320. For a 4 MHZ master clock, this divides the master frequency to preferably 12.5 KHZ to provide a slower frequency source for the counter 164. The overflow output of the counter generates the gate control signal GCN which is additionally fed back through inverter 166 to clear the D flip flop 160.

The conversion control 116 additionally includes a shift register formed of four D flip flops 168, 178, 180, and 182. The register is formed by tying the Q output of each previous stage to the D input of the next succeeding stage. The clock inputs CLK of the D flip flops 168, 178, 180, and 182 are connected to the master clock frequency MCLK. The initial stage of the register, flip flop 168, receives at its D input the conversion finish signal CFN from the count control circuit 114. AND gate 184 decodes the coincidence of the Q output of the second stage and OVS/Q/ output of the third stage of the register to form a pulse which becomes the latch data signal LCH. Further, AND gate 186 decodes the Q output of the third stage and the OVS/Q/ output of the fourth stage to form a pulse which becomes the conversion ready signal CRD. The output of AND gate 186 additionally clears the counter 164 and becomes the clear counter signal CCN.

The count control circuit which is more fully detailed in FIG. 10 will now be described with respect to those referenced devices. The count control circuit 114 includes a pair of JK flip flops 188, 190 with preset inputs PR and clear inputs CLR. Both preset inputs PR and the J input of flip flop 118 are connected commonly to a source of voltage +V. The K inputs of both flip flops 188 and 190 are grounded. The input to the clock input CK of flip flop 188 is the start signal SRT while the input to the clock input CK of the flip flop 190 is the stop signal STP. The Q output of flip flop 188 is applied to the J input of flip flop 190. The gate control signal GCN is applied to the clear inputs CLR of both flip flops 188, 190. NAND gate 192 which has four inputs receives the master clock signal MCLK, the Q output of flip flop 188, the OVS/Q/ output of flip flop 190, and the gate control signal GCN. Its output which is a logical combination of these signals is the gated clock signal GCK. Additionally, the count control circuit 114 outputs the conversion finish signal CFN as the Q output of the flip flop 190.

In this configuration the count control circuit 114 initiates the gated clock signal GCK through the NAND gate 192 upon the coincidence of the gate control signal GCN and the start signal SRT. The count control circuit continues this signal until it terminates the gated clock signal GCK upon the stop signal STP. The conversion finish signal CFN is generated subsequent to the stop signal STP.

The method of converting the phase modulated signals E1, E2 or the other phase modulated signals into a digital number N will now be more fully described in detail with reference to the waveform diagram FIGS. 11a–m and the circuitry of FIGS. 6–10. The sequence of events for the conversion is initiated by a conversion request signal CRQ in the form of a pulse being received by the conversion control circuit 116 in FIG. 9. The pulse which is illustrated in FIG. 11d causes flip flop 160 to set on its leading edge. The logical one of the Q output of flip flop 160, illustrated in FIG. 11e, enables AND gate 162 and permits the 12.5 KHZ signal to clock the counter 164.

The counter is incremented by the 12.5 KHZ signal until it overflows generating the gate control signal GCN as a logical one from its 0 output. The gate control signal GCN preferably changes state from a logical zero to a logical one after eight clock pulses or 0.64 msec subsequent to the conversion request pulse as is illustrated in FIGS. 11f, g. The purpose of this time delay between the leading edge of the CRQ signal and the GCN signal is to allow for the finite time required by multiplexer 108 to perform its switching operation of connecting the selected phase shift network to the zero cross circuits 110, 112. Simultaneously, with the gate control signal becoming a logical one, the flip flop 160 is reset via the inverter 166. This is illustrated as the Q output of flip flop 160 making a transition to zero in FIG. 11e.

Figure 10:
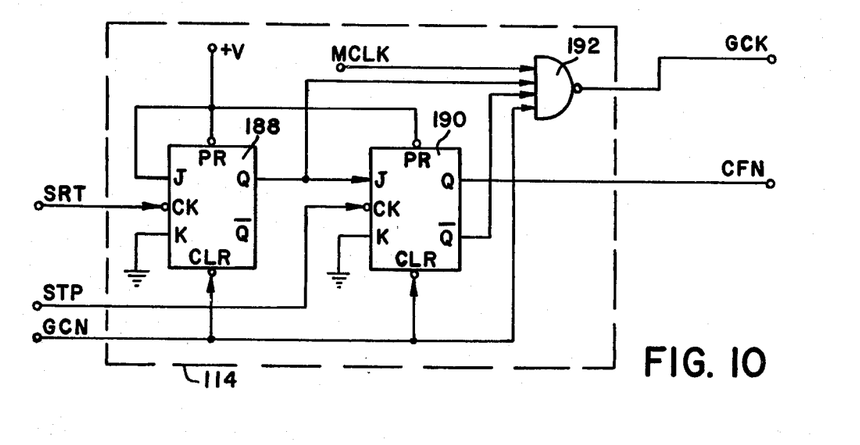
FIG. 10 is a detailed electrical schematic view of the count control illustrated in FIG. 6.

The generation of the gate control signal GCN (FIG. 11g) enables the count control circuit 114 illustrated in FIG. 10. Until the positive transition of the GCN signal, the zero logic level from the output of counter 164 has held flip flop 188, flip flop 190, and AND gate 192 disabled. After enablement, the first negative transition 200 of the start signal SRT will set flip flop 188 as illustrated at 204 in FIG. 11h.

The Q output of flip flop 188, the Q output of flip flop 190, and the signal GCN are all a logical one at this time and thus enable the gated clock signal GCK to be generated by AND gate 192 as is illustrated in FIG. 11k. The gated clock signal GCK increments the counter 118 until a negative transition 202 of the stop signal STP occurs. The negative transition of the stop signal STP clocks the high logical level at the J input of flip flop 190 to the output causing the flip flop to set. This action is illustrated in FIG. 11i as the conversion finish signal CFN being generated by the Q output of flip flop 190 at 208. The setting of the flip flop 190 further causes the OVS/Q/ output to fall and disable the AND gate 192 when it changes state to a logical zero at 206.

It is seen that the counter 118 has been incremented by the gated clock signal GCK between the falling edge 200 of the start signal SRT and the falling edge 202 of the stop signal STP. The time delay dt between the two signals is equivalent to the phase difference (t1-t2) of the signals E1, E2 and a digital representation of one is a representation of the other. The counter 118 will therefore contain a digital representation of the phase difference between the two PM signals E1, E2.

Because the Q output of flip flop 188 is connected to the J input of flip flop 190, the count control circuit is assured that the gated clock signal GCK will always begin with a SRT signal and end with an STP signal rather than vice versa. This connection also assures that the STP signal will have no effect unless a SRT signal is first applied to flip flop 188. When the gate control signal GCN returns to a logical zero, the flip flop 188, 190 are cleared and ignore further SRT, STP signals until another conversion requestion signal CRQ sets the gate control signal GCN to a logical one.

The logical one of the conversion finish signal CFN (at 208 in FIG. 11i) is transmitted to the conversion control circuitry 116 where it sets D flip flop 168 on the next clock pulse of the master clock signal MCLK. The one output of the flip flop 168 is thereafter shifted to succeeding stages of the shift register upon each clock pulse. AND gate 184 decodes the one shifted at the second clock pulse after the conversion finish signal and produces a pulse 210 one clock width in duration. This pulse becomes the latch data signal LCH input to latch 120 which causes a data transfer from the counter 118 into the latch 120. On the third clock pulse after the conversion finish signal goes high, AND gate 186 similarly produces a pulse 212 one clock width in duration. The leading edge of pulse 212 clears counter 164 causing the gate control signal GCN to make a state change to a logical zero at 214. The low GCN signal applied to the CLR inputs of flip flop 188, 190 cause their Q outputs to make a logical one to zero transition at 218, 216, respectively. Additionally, the pulse 212 clears the counter 118 and becomes the conversion ready signal CRD transmitted to the microprocessor.

While the preferred embodiment of the invention has been shown and described, it will be obvious to those skilled in the art that various modifications and changes may be made thereto without departing from the scope and spirit of the invention as is hereinafter defined in the appended claims.

What is claimed is:

1. A method for transforming a linear variable differential transformer output into a digital number comprising the steps of:
   generating an amplitude modulated signal K sin (wt) from one of the secondary output terminals of the LVDT, where w is the frequency of a carrier excitation and K is the position of the armature of the LVDT;
   generating an amplitude modulated signal (1−K) sin (wt) from the other secondary output terminal of the LVDT;
   converting said AM signals into phase modulated signals of the form sin (wt−θ+45°) and sin (wt+θ−45°) where cos θ is an approximation of K and sin θ is an approximation of 1−K as K varies from 0 to 1;
   converting the phase difference between said PM signals into a digital number which is a linear function of θ;
   calculating K from the values of θ and the equation:

$$\theta = \text{arc tangent } \frac{1-K}{K}.$$

2. A processor for converting pairs of amplitude modulated signals from a plurality of transducers of at least two types into digital numbers, said processor comprising:
   means for phase converting each pair of AM signals into a pair of phase modulated signals of the form sin (wt−A+45°) and sin (wt+A−45°) where A is a linear function of at least one of the amplitude modulations of one of the type of transducers;
   means for converting the phase difference of the phase modulated signals into a digital number proportional to the difference;
   means, responsive to an address indicative of the transducer output desired, for multiplexing the pair of phase modulated signals from the indicated transducer to said digital number converting means; and
   means for correcting the error in the digital number for transducers whose outputs are non linear functions of A.

3. A processor as defined in claim 2, wherein:
   one type of transducer is a resolver of a rotary position and outputs a pair of amplitude modulated signals of the form sin θ sin (wt) and cos θ sin (wt).

4. A processor as defined in claim 3, wherein:

another type of transducer is a resolver of a linear position and outputs a pair of amplitude modulated signals of the form K sin (wt) (1−K) sin (wt).

5. A processor as defined in claim 4, wherein:

said phase conversion means is a resistor-capacitor network having a frequency factor jwrc equivalent to one.

6. A processor as defined in claim 5, wherein:

$\theta$ is equivalent to A.

7. A processor as defined in claim 6, wherein:

said correcting means corrects the outputs from the linear position resolver as a function of the arc tangent of the ratio (1−K)/K.

* * * * *